(12) United States Patent
Huang et al.

(10) Patent No.: US 10,880,038 B2
(45) Date of Patent: Dec. 29, 2020

(54) METHOD FOR CONSTRUCTING SEQUENCE OF POLAR CODES AND APPARATUS

(71) Applicant: HUAWEI TECHNOLOGIES CO., LTD., Guangdong (CN)

(72) Inventors: Lingchen Huang, Hangzhou (CN); Gongzheng Zhang, Hangzhou (CN); Chen Xu, Hangzhou (CN); Chaolong Zhang, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 29 days.

(21) Appl. No.: 16/058,118

(22) Filed: Aug. 8, 2018

(65) Prior Publication Data
US 2018/0351699 A1    Dec. 6, 2018

Related U.S. Application Data

(63) Continuation of application No. PCT/CN2018/080347, filed on Mar. 23, 2018.

(30) Foreign Application Priority Data

Mar. 24, 2017  (CN) .......................... 2017 1 0184924

(51) Int. Cl.
*H03M 13/00* (2006.01)
*H04L 1/00* (2006.01)
*H03M 13/13* (2006.01)

(52) U.S. Cl.
CPC .......... *H04L 1/0058* (2013.01); *H03M 13/13* (2013.01); *H03M 13/618* (2013.01); *H03M 13/6362* (2013.01); *H04L 1/0067* (2013.01)

(58) Field of Classification Search
CPC ................ H04L 1/0058; H04L 1/0067; H03M 13/6362; H03M 13/13; H03M 13/618
See application file for complete search history.

(56) References Cited

U.S. PATENT DOCUMENTS

2015/0333769 A1    11/2015  Jeong et al.
2017/0012740 A1    1/2017  Shen et al.
(Continued)

FOREIGN PATENT DOCUMENTS

CA      2972832 A1    7/2015
WO   2015100561 A1    7/2015
(Continued)

OTHER PUBLICATIONS

R1-1611254 Huawei, HiSilicon,"Details of the Polar code design",3GPP TSG RAN WG1 Meeting #87,Reno, USA, Nov. 10-14, 2016,total 15 pages.
(Continued)

*Primary Examiner* — Samir W Rizk
(74) *Attorney, Agent, or Firm* — Fish & Richardson P.C.

(57) ABSTRACT

Embodiments of this application provide a method and an apparatus for constructing a sequence of polar codes. In an implementation, a construction sequence P' is read from a construction sequence P, where the length of the construction sequence P' is an encoding length M and the length of the construction sequence P is N. The construction sequence P' is demapped to a reliability ranking sequence Q' based on a rate matching rule, and K elements that have largest reliability values is read from the reliability ranking sequence Q', to obtain an information bit sequence number set A.

10 Claims, 5 Drawing Sheets

(56) References Cited

U.S. PATENT DOCUMENTS

2017/0077954 A1 3/2017 Shen et al.
2019/0149176 A1* 5/2019 Hui .................. H03M 13/6356
714/790

FOREIGN PATENT DOCUMENTS

WO  2015143593 A1  10/2015
WO  2015180187 A1  12/2015

OTHER PUBLICATIONS

R1-1702850 NTT DOCOMO,"Discussion on construction of Polar codes",3GPP TSG RAN WG1 Meeting #88,Athens, Greece Feb. 13-17, 2017,total 9 pages.

International Search Report issued in International Application No. PCT/CN2018/080347 dated Jun. 27, 2018, 10 pages.

R1-1702735—MediaTek Inc., "Polar Code Size and Rate-Matching Design for NR Control Channels," 3GPP TSG RAN1 RAN1 #88 Meeting, Athens, Greece, Feb. 13-17, 2017, 8 pages.

R1-1701602—ZTE et al., "Rate Matching of Polar Codes for eMBB," 3GPP TSG RAN WG1 Meeting #88, Athens, Greece, Feb. 13-17, 2017, 20 pages.

Office Action issued in Chinese Application No. 201810798242.8 dated Apr. 26, 2019, 7 pages.

Bioglio et al: "Low-Complexity Puncturing and Shortening of Polar Codes", Arxiv.org: arXiv.1701.006458v1, Cornell University Library, Jan. 23, 2017, 6 pages.

LG Electronics, "Design of Polar code for control channel," 3GPP TSG RAN WG1 NR Meeting #88 (R1-1703454), Athens, Greece, Feb. 13-17, 2017, 8 pages.

MediaTek Inc., "Examination of NR Coding Candidates for Low-Rate Applications," 3GPP TSG RAN WG1 Meeting #86 (R1-167533), Gothenburg, Sweden, Aug. 22-26, 2016, 12 pages.

Extended European Search Report issued in European Application No. 18746067.0 dated Apr. 5, 2019, 9 pages.

EPO Communication pursuant to Article 94(3) EPC issued in European Application No. 18746067.0 dated Aug. 10, 2020, 6 pages.

Huawei, HiSilicon, "Polar code design and rate matching," 3GPP TSG RAN WG1 Meeting #86, R1-167209, Gothenburg, Sweden, Aug. 22-26, 2016, 6 pages.

* cited by examiner

METHOD FOR CONSTRUCTING SEQUENCE OF POLAR CODES AND APPARATUS

CROSS-REFERENCE TO RELATED APPLICATIONS

This application is a continuation of International Application No. PCT/CN2018/080347, filed on Mar. 23, 2018, which claims priority to Chinese Patent Application No. 201710184924.5, filed on Mar. 24, 2017. The disclosures of the aforementioned applications are hereby incorporated by reference in their entireties.

TECHNICAL FIELD

This application relates to the communications field, and in particular, to a technical solution to constructing a sequence of polar codes.

BACKGROUND

Rapid evolution of wireless communications predicts that a future 5G communications system will present some new characteristics. Three most typical communication scenarios include Enhanced Mobile Broadband (eMBB), Massive Machine Type Communication (mMTC), and Ultra Reliable Low Latency Communication (URLLC). Requirements of these communication scenarios pose a new challenge to an existing LTE technology.

As a most fundamental wireless access technology, channel encoding is one of important research objects that meet a 5G communications requirement. After Shannon theorem is proposed, scholars from various countries have been devoted to finding an encoding and decoding method that can reach the Shannon limit and has relatively low complexity. In a 5G standard formulation process, an LDPC code has been used as a data channel encoding scheme in an eMBB scenario, and a sequence of polar codes has been used as a control channel encoding scheme in the eMBB scenario. However, a URLLC scenario and an mMTC scenario have a strict requirement for delay and reliability of channel encoding.

A sequence of polar codes (Polar Codes) is an encoding manner that is proposed by Arikan based on channel polarization. The sequence of polar codes is the first and the only known channel encoding method that can be strictly proven to "reach" a channel capacity.

Encoding and decoding of a sequence of polar codes is briefly described as follows:

The sequence of polar codes is linear block code. A generator matrix of the sequence of polar codes is $F_N$, and an encoding process of the sequence of polar codes is $x_1^N = u_1^N F_N$, where $u_1^N = (u_1, u_2, \ldots u_N)$ is a binary row vector whose length is N (that is, a code length), $F_N$ is an N×N matrix, and $F_N = F_2^{\otimes (\log_2 N)}$. Herein, $$F_2 = \begin{bmatrix} 1 & 0 \\ 1 & 1 \end{bmatrix},$$

and $F_2^{\otimes(\log_2 N)}$ is defined as a Kronecker (Kronecker) product of $\log_2 N$ matrices $F_2$. The addition operation and the multiplication operation mentioned above are respectively an addition operation and a multiplication operation that are in a binary Galois field (Galois Field). In a process of encoding a sequence of polar codes, some bits in $u_1^N$ are used to carry information, and are referred to as information bits, a set of indexes of these bits is denoted as A, and is referred to as an information bit position set or an information bit sequence number set. The other bits are set to fixed values pre-agreed on by a transmit end and a receive end, these bits are referred to as fixed bits, and a set of indexes of these bits is denoted as a complementary set $A^c$ of A.

It is noted that in a classic sequence of polar codes, an information bit is a part that carries information. In practice, because an information bit may further undergo cyclic redundancy check encoding, parity check encoding, and the like before encoding of a sequence of polar codes, an index set A in a process of constructing a sequence of polar codes includes K_info+K_check sequence numbers of information bits of highest reliability other than punctured bits. K_info is a quantity of information bits, K_check is a quantity of check bits, the check bits include but are not limited to CRC bits and dynamic check bits, and K_check≥0. Generally, in examples of construction of a sequence of polar codes in the following, a quantity K of information bits is used as an example, and the check bits are included in the information bits.

A process of determining an information bit set A based on an information bit length and an encoding codeword length is referred to as a process of constructing a sequence of polar codes. At present, a sequence of polar codes is constructed by using methods such as online calculation of reliability (error probability) of each subchannel and offline storage of a construction sequence and a reliability ranking sequence.

However, during a creation process of this application, it is found that efficiency in constructing a construction sequence of a sequence of polar codes in the prior art is relatively low.

SUMMARY

To resolve a prior-art problem of low efficiency in constructing a sequence of polar codes, this application provides a method for constructing a sequence of polar codes and a corresponding apparatus.

A technical solution provided in embodiments of this application is as follows: During construction of a sequence of polar codes, each element in a reliability ranking sequence $\{Q_i, 0 \leq i < N_{max}\}$ (referred to as sequence Q for short) is mapped in a one-to-one manner to a deformed construction sequence $\{P_i, 0 \leq i < N_{max}\}$ (referred to as sequence P for short), where rate matching is implied in the mapped construction sequence P. During construction of a sequence of polar codes, first, a construction sequence P' whose length is the same as a code length of a to-be-constructed sequence of polar codes is read from the construction sequence P; then, the construction sequence P' is demapped to a reliability ranking sequence Q' based on a rate matching rule; and finally, the sequence of polar codes is constructed based on the reliability ranking sequence Q'.

According to another aspect, this application provides an apparatus for constructing a sequence of polar codes, including: a memory, configured to store a construction sequence P, where the construction sequence P is generated based on a reliability ranking sequence Q and a rate matching rule; and a processor, configured to read a construction sequence P' whose length is the same as an encoding code length of a to-be-constructed sequence of polar codes from the construction sequence P. The processor is further configured to demap the construction sequence P' to a reliability ranking sequence Q' based on a rate matching rule, and construct the sequence of polar codes based on the reliability ranking sequence Q'.

The rate matching rule is a rate matching function or a rate matching sequence. The rate matching sequence is any one of the following five types:

| Sequence number | Puncturing/shortening | Rate matching sequence (in a puncturing/shortening order) |
|---|---|---|
| 1 | Puncturing | $c_0, c_1, c_2, \ldots c_{\frac{N}{2}-1}$ |
| 2 | Puncturing | $C_{BIV(0)}, C_{BIV(1)}, C_{BIV(2)}, \ldots C_{BIV(\frac{N}{2}-1)}$, BIV(.), which is a bit reversal order |
| 3 | Puncturing | $c_0, c_1, c_2, \ldots c_{\frac{N}{4}-1}, c_{\frac{N}{4}}, c_{\frac{N}{2}}, c_{\frac{N}{4}+1}, c_{\frac{N}{2}+1}, \ldots, c_{\frac{3}{8}N-1}, c_{\frac{5}{8}N-1}$ |
| 4 | Shortening | $c_{N-1}, c_{N-2}, \ldots c_{\frac{N}{2}}$ |
| 5 | Shortening | $c_{N-1}, c_{N-2}, \ldots c_{\frac{3}{4}N}, c_{\frac{3}{4}N-1}, c_{\frac{N}{2}-1}, c_{\frac{3}{4}N-2}, c_{\frac{N}{2}-2}, \ldots, c_{\frac{5}{8}N}, c_{\frac{3}{8}N}$ |

The rate matching rule is a combination of two rate matching sequences. The two rate matching sequences are any one of the following four types:

| Sequence number | Puncturing/shortening | Two rate matching sequences that are mutually complementary sets (in a puncturing/shortening order) |
|---|---|---|
| 1 | Puncturing + shortening | Puncturing: $c_0, c_1, c_2, \ldots c_{\frac{N}{4}-1}, c_{\frac{N}{4}}, c_{\frac{N}{2}}, c_{\frac{N}{4}+1}, c_{\frac{N}{2}+1}, \ldots, c_{\frac{3}{8}N-1}, c_{\frac{5}{8}N-1}$ <br><br> Shortening: $c_{N-1}, c_{N-2}, \ldots c_{\frac{3}{4}N}, c_{\frac{3}{4}N-1}, c_{\frac{N}{2}-1}, c_{\frac{3}{4}N-2}, c_{\frac{N}{2}-2}, \ldots, c_{\frac{5}{8}N}, c_{\frac{3}{8}N}$ |
| 2 | Puncturing + shortening | Puncturing: $C_{BIV(0)}, C_{BIV(1)}, C_{BIV(2)}, \ldots C_{BIV(\frac{N}{2}-1)}$ <br><br> Shortening: $C_{BIV(N-1)}, C_{BIV(N-2)}, \ldots C_{BIV(\frac{N}{2})}$ <br><br> BIV(.), which is a bit reversal order operation |
| 3 | Puncturing + shortening | Puncturing: Puncturing $c_0, c_2, c_4, c_6, \ldots, c_{N-2}$ <br><br> Shortening: $C_{BIV(N-1)}, C_{BIV(N-2)}, \ldots C_{BIV(\frac{N}{2})}$ <br><br> BIV(.), which is a bit reversal order operation |
| 4 | Puncturing + shortening | Puncturing: $c_0, c_1, c_2, \ldots c_{\frac{N}{2}-1}$ <br><br> Shortening: $c_{N-1}, c_{N-2}, \ldots c_{\frac{N}{2}}$ |

An embodiment of this application provides a terminal. A function of the terminal may be implemented by hardware. A structure of the terminal includes a transceiver and a processor. Alternatively, the function may be implemented by executing corresponding software by hardware. The hardware or the software includes one or more modules corresponding to the foregoing function. The modules may be software and/or hardware.

According to still another aspect, an embodiment of this application provides a network-side device. The network-side device may be a base station, or may be a control node.

According to yet another aspect, an embodiment of this application provides a base station. The base station has a function of implementing behavior of a base station in the foregoing method design. The function may be implemented by hardware, or implemented by executing corresponding software by hardware. The hardware or the software includes one or more modules corresponding to the foregoing function.

In a possible design, a structure of the base station includes a processor and a transceiver. The processor is configured to allow the base station to perform a corresponding function in the foregoing method. The transceiver is configured to support communication between the base station and UE, send information or an instruction related to the foregoing method to the UE, and receive information or an instruction that is sent by the base station. The base station may further include a memory. The memory is configured to be coupled to the processor and store a program instruction and data that are necessary for the base station.

According to still yet another aspect, an embodiment of this application provides a control node. The control node may include a controller/processor, a memory, and a communications unit. The controller/processor may be configured to coordinate resource management and configuration between a plurality of base stations and may be configured to implement the method described in the foregoing embodiment. The memory may be configured to store program code and data of the control node. The communications unit is configured to support communication between the control node and a base station.

According to a further aspect, an embodiment of this application provides a communications system. The system includes the base station and the terminal according to the foregoing aspects. Optionally, the system may further include the control node in the foregoing embodiment.

According to a still further aspect, an embodiment of this application provides a computer storage medium, configured to store a computer software instruction used by the foregoing base station, where the computer software instruction includes a program used to execute designs of the foregoing aspects.

According to a yet further aspect, an embodiment of this application provides a computer storage medium, configured to store a computer software instruction used by the foregoing terminal, where the computer software instruction includes a program used to execute designs of the foregoing aspects.

BRIEF DESCRIPTION OF DRAWINGS

To describe the technical solutions in the embodiments of this application more clearly, the following briefly describes the accompanying drawings required for describing the embodiments of this application. Apparently, the accompanying drawings in the following description show merely some embodiments of this application, and a person of ordinary skill in the art may still derive other drawings from these accompanying drawings without creative efforts.

DESCRIPTION OF EMBODIMENTS

The embodiments provided in this application are described below.

Figure 1:
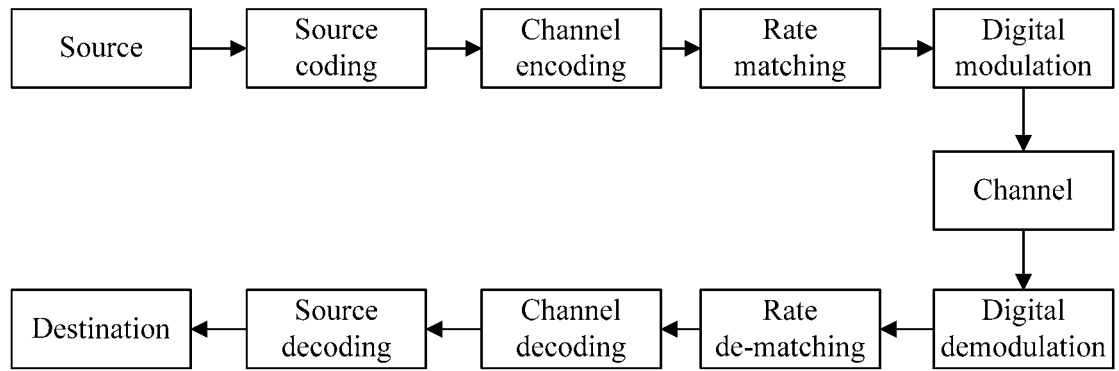
FIG. 1 is a schematic diagram of an implementation scenario of a method for constructing a sequence of polar codes according to this application.

In a next generation communications network, three most typical communication scenarios include eMBB, mMTC, and URLLC. Requirements of these communication scenarios pose a new challenge to an existing LTE technology. To improve data transmission reliability, channel encoding that is used to ensure communication quality is a most fundamental wireless access technology. As shown in FIG. 1, first, channel encoding is performed on source information; then, rate matching and digital modulation are performed on encoded information, encoded and modulated information is transmitted to a receive end through a channel, and corresponding digital demodulation and rate dematching are performed at the receive end; and finally, information is obtained by using an encoding technology that corresponds to the channel encoding.

The embodiments of this application provide a technical solution to constructing a sequence of polar codes in a channel encoding process shown in FIG. 1.

For a reliability ranking sequence Q of a given length, a value of an element with a relatively small sequence number i corresponds to a subchannel of relatively low reliability (in ascending order of reliability), or a value of an element with a relatively small sequence number i corresponds to a subchannel of relatively high reliability (in descending order of reliability).

Then, each element in the reliability ranking sequence Q (referred to as sequence Q for short) is mapped in a one-to-one manner to a deformed construction sequence P (referred to as sequence P for short). A rate matching rule is implied in the mapped construction sequence P.

A process of calculating the sequence P based on the sequence Q and rate matching is usually performed offline. Before construction of a sequence of polar codes, the (one or more) calculated sequences P are stored, and usually, the reliability ranking sequence Q is not stored.

During construction of a sequence of polar codes, first, a construction sequence P' whose length is the same as an encoding code length M of a to-be-constructed sequence of polar codes is read from a construction sequence P corresponding to a mother code sequence (which may be a mother code sequence of a largest length, or may be one of a plurality of mother code sequences); then, the construction sequence P' is demapped to a reliability ranking sequence Q' based on the rate matching rule; and finally, the polar codes whose information length is K and whose encoding length is M is constructed based on the reliability ranking sequence Q'. Specifically, a set of $K_{info}+K_{check}$ positions of highest reliability other than punctured bits is selected from the reliability ranking sequence Q', where $K_{info}$ is a quantity of information bits, $K_{check}$ is a quantity of check bits, a check bit includes but is not limited to a CRC bit or a dynamic check bit, and $K_{check} \geq 0$. Then, a corresponding information bit sequence and a corresponding dynamic check bit sequence (if any) are mapped to these positions of highest reliability. The remaining is a set of static frozen bit positions, and a value of the set is set to a fixed value pre-agreed on by a transmit end and a receive end. Generally, in examples of construction of a sequence of polar codes in the following, a quantity K of information bits is used as an example, and the check bits are included in the information bits.

In examples in subsequent embodiments, first obtaining an information bit sequence number set is used as an example, and has a principle the same as that for first obtaining a frozen bit sequence number set and then obtaining its complementary set to obtain an information bit sequence number set, which is not described herein.

The following describes a method for constructing a sequence of polar codes provided in this application from Embodiment 1 to Embodiment 4.

Embodiment 1

This embodiment mainly describes the following process: for a reliability ranking sequence $\{Q_i, 0 \leq N, N=2^n\}$ constructed based on any single rate matching rule (to be specific, there is no need to switch between a plurality of rate matching rules based on a working condition) and a given sequence of polar codes, where N is a length of a sequence Q, calculating a construction sequence P to which the rate matching rule is mapped, and constructing a sequence of polar codes whose code length is $$M\left(\frac{N}{2} < M \leq N\right)$$

and whose information length is K.

It should be noted that, when the code length $$M < \frac{N}{2},$$

the construction sequence P is calculated based on the reliability ranking sequence Q whose length is $$\frac{N}{2},$$

and then the sequence of polar codes is constructed by using the construction sequence P.

Figure 2:
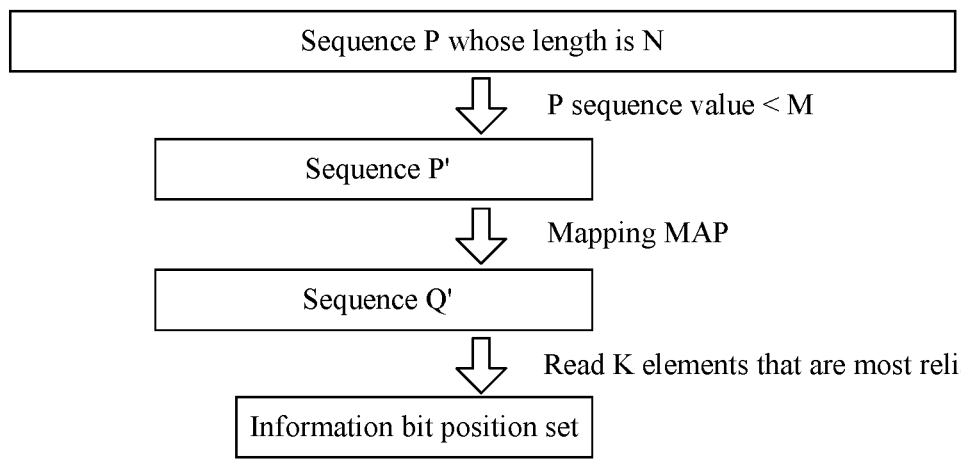
FIG. 2 is a schematic diagram of Embodiment 1 of a method for constructing a sequence of polar codes according to this application.
Figure 3:
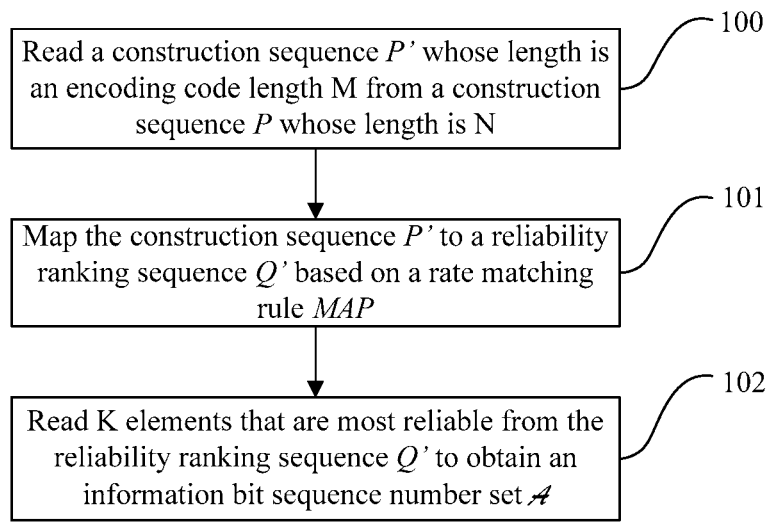
FIG. 3 is a flowchart of Embodiment 1 of a method for constructing a sequence of polar codes according to this application.

A schematic diagram of a process of constructing a sequence of polar codes in this embodiment of this application is shown in FIG. 2, a flowchart of the process is shown in FIG. 3, and steps for implementing the process are as follows:

Step 100: Read a construction sequence P' whose length is the same as an encoding code length M from a construction sequence P whose length is N.

Step 101: Demap the construction sequence P' to a reliability ranking sequence Q' based on a rate matching rule.

Step 102: Read K elements having largest reliability values from the reliability ranking sequence Q' to obtain an information bit sequence number set A, where its complementary set $A^c$ (relative to a set $\{0, 1, 2 \ldots, N-1\}$) is a frozen bit position set.

It should be noted that the construction sequence P whose length is N in the foregoing step 100 is calculated based on a reliability ranking sequence Q and rate matching, and calculation steps are as follows:

(1) Obtain a rate matching sequence $\{RM_i, 0 \leq N\}$ based on rate matching, where a larger sequence number i indicates that a corresponding bit position $RM_i$ is to be preferentially punctured or shortened.

(2) Read elements in the rate matching sequence one by one from back to front based on a reliability ranking sequence Q whose length is $N=2^n$ and the rate matching sequence $\{RM_i, 0 \leq i < N\}$, and search the reliability ranking sequence Q for an element that meets $Q_j = RM_i$.

(3) Set $P_j = i$.

(4) Repeat the foregoing steps until all elements in the rate matching sequence are read to constitute the construction sequence P whose length is N.

In addition, a process of demapping the construction sequence P' to the reliability ranking sequence Q' based on the rate matching rule in the foregoing step 101 may be performed in a function form or in a sequence form.

In Embodiment 1, a rate matching rule that is applicable to a puncturing or shortening order of encoded codewords $c_0, c_1, c_2, \ldots c_{N-1}$ includes but is not limited to five types shown in the following Table 1.

TABLE 1

| Sequence number | Rate matching manner (in a puncturing/ shortening order) | Rate matching sequence (in a puncturing/shortening order) |
|---|---|---|
| 1 | Puncturing | $c_0, c_1, c_2, \ldots c_{\frac{N}{2}-1}$ |
| 2 | Puncturing | $c_{BIV(0)}, c_{BIV(1)}, c_{BIV(2)}, \ldots c_{BIV\left(\frac{N}{2}-1\right)}$, BIV(.), which is a bit reversal order |
| 3 | Puncturing | $c_0, c_1, c_2, \ldots c_{\frac{N}{4}-1}, c_{\frac{N}{4}}, c_{\frac{N}{2}}, c_{\frac{N}{4}+1}, c_{\frac{N}{2}+1}, \ldots, c_{\frac{3}{8}N-1}, c_{\frac{5}{8}N-1}$ |
| 4 | Shortening | $c_{N-1}, c_{N-2}, \ldots c_{\frac{N}{2}}$ |

TABLE 1-continued

| Sequence number | Rate matching manner (in a puncturing/ shortening order) | Rate matching sequence (in a puncturing/shortening order) |
|---|---|---|
| 5 | Shortening | $c_{N-1}, c_{N-2}, \ldots c_{\frac{3}{4}N}, c_{\frac{3}{4}N-1}, c_{\frac{N}{2}-1}, c_{\frac{3}{4}N-2}, c_{\frac{N}{2}-2}, \ldots, c_{\frac{5}{8}N}, c_{\frac{3}{8}N}$ |

Using a second rate matching rule $$C_{BIV(0)}, C_{BIV(1)}, C_{BIV(2)}, \ldots C_{BIV\left(\frac{N}{2}-1\right)},$$

BIV(•) that is a bit reversal order as an example, a reliability ranking sequence Q whose code length is N=8 is shown in Table 2, and a rate matching sequence is shown in Table 3.

TABLE 2

Reliability ranking sequence Q

| 0 | 1 | 2 | 4 | 3 | 5 | 6 | 7 |
|---|---|---|---|---|---|---|---|

TABLE 3

Rate matching sequence

| 7 | 3 | 5 | 1 | 6 | 2 | 4 | 0 |
|---|---|---|---|---|---|---|---|

Elements in the rate matching sequence shown in Table 3 are read one by one from back to front based on the reliability ranking sequence Q shown in Table 2, the sequence Q in Table 2 is searched for an element that meets $Q_j = RM_i$, and $P_j = i$ is set. A process is shown in Table 4.

TABLE 4

Tectonic sequence P generation process

| 7 |   |   |   |   |   |   |   |
|---|---|---|---|---|---|---|---|
| 7 |   | 6 |   |   |   |   |   |
| 7 | 5 | 6 |   |   |   |   |   |
| 7 | 5 | 6 |   |   |   | 4 |   |
| 7 | 3 | 5 | 6 |   |   | 4 |   |
| 7 | 3 | 5 | 6 |   | 2 | 4 |   |
| 7 | 3 | 5 | 6 | 1 | 2 | 4 |   |
| 7 | 3 | 5 | 6 | 1 | 2 | 4 | 0 |

The foregoing steps are repeated until all elements in the rate matching sequence are read, and the construction sequence P whose length is N is constituted as shown in Table 5.

TABLE 5

Tectonic sequence P

| 7 | 3 | 5 | 6 | 1 | 2 | 4 | 0 |
|---|---|---|---|---|---|---|---|

In Embodiment 1, mapping is performed in a sequence form. However, alternatively, in an embodiment of this application, mapping may be performed in another form such as in a function form.

A process of constructing a sequence of polar codes whose encoding code length is 6 and whose information length is 4 is as follows:

(1) Read six sequence elements whose element values are less than 6 from a construction sequence P={7,3,5,6,1,2,4,0} without changing an element position sequential order, to constitute a construction sequence P'={3,5,1,2,4,0}.

(2) Demap the construction sequence P' based on a mapping sequence MAP={$RM_i$, 0≤i<N}={7,3,5,1,6,2,4,0} to obtain a reliability ranking sequence Q'={1,2,3,5,6,7}.

(3) Select the last four elements in the sequence Q as an information bit sequence number set A={3,5,6,7}, where a corresponding frozen bit position set is $A^c$={0,1,2,4}.

It should be noted that the information bit sequence number set may also be referred to as an information bit position set.

Embodiment 2

This embodiment describes a process of constructing a sequence of polar codes based on a reliability ranking sequence Q that has a nesting characteristic.

The having a nesting characteristic means that a reliability ranking sequence {$Q_i$, 0≤i<N} whose code length is $N=2^n$ is a set including an element that meets $Q_i < N$ and that can be obtained from a reliability ranking sequence {$Q_1$, 0≤i<$N_{max}$} corresponding to a mother code sequence of a largest length $N_{max}$, where the elements remain in an original sequential order.

Figure 4:
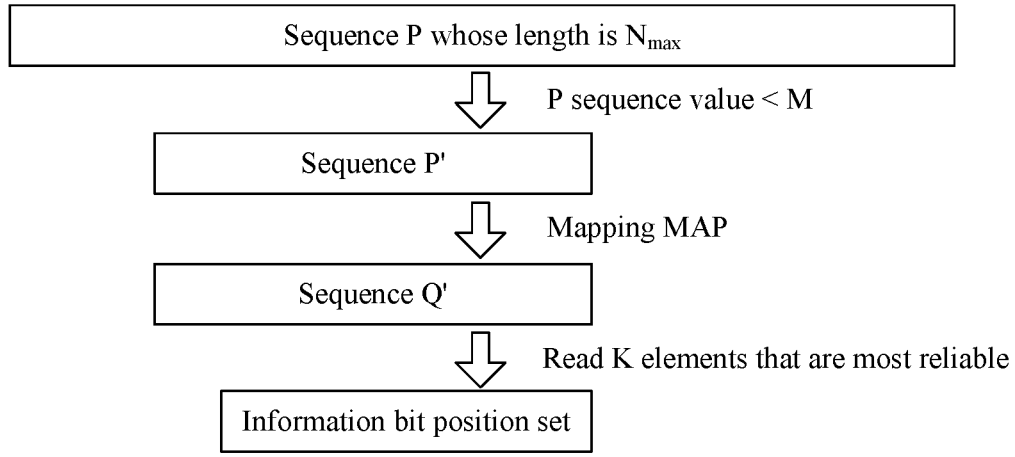
FIG. 4 is a schematic diagram of Embodiment 2 of a method for constructing a sequence of polar codes according to this application.
Figure 5:
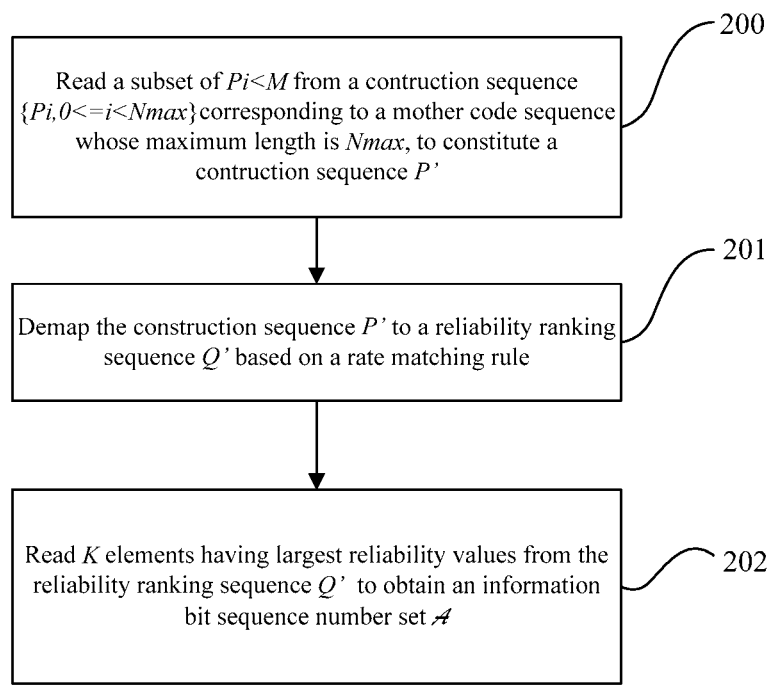
FIG. 5 is a flowchart of Embodiment 2 of a method for constructing a sequence of polar codes according to this application.

In this embodiment, a sequence {$P_i$, 0≤i<$N_{max}$} is calculated based on {$Q_i$, 0≤i<$N_{max}$}, so that a schematic diagram of constructing a sequence of polar codes whose code length is M and whose information length is K with reference to a mapping MAP={$RM_i$, 0≤i<$N_{max}$} is shown in FIG. 4, and a flowchart is shown in FIG. 5.

First, a construction sequence $P_{max}$ corresponding to a mother code sequence whose maximum length is $N_{max}$ is obtained based on rate matching and a reliability ranking sequence $Q_{max}$ corresponding to the mother code sequence whose maximum length is $N_{max}$. Calculation steps are as follows:

(1) For the reliability ranking sequence $Q_{max}$ corresponding to the mother code sequence whose maximum length is $N_{max}$, obtain a rate matching sequence {$RM_i$, 0≤i<$N_{max}$} based on a rate matching rule, where a larger sequence number i indicates that a corresponding bit position $RM_i$ is to be preferentially punctured or shortened.

(2) Read elements in the rate matching sequence one by one from back to front based on the rate matching sequence {$RM_i$, 0≤i<$N_{max}$}, and search the sequence $Q_{max}$ whose maximum length is $N_{max}$ for an element that meets $Q_j = RM_i$.

(3) Set $P_j = i$.

(4) Repeat the foregoing steps until all elements in the rate matching sequence are read to constitute the construction sequence $P_{max}$ whose maximum length is $N_{max}$.

A process of constructing a sequence of polar codes by using the construction sequence $P_{max}$ corresponding to the mother code sequence whose maximum length is $N_{max}$ is as follows:

Step 200: Read a subset of $P_i<M$ from a construction sequence $\{P_i, 0≤i<N_{max}\}$ corresponding to a mother code sequence whose maximum length is $N_{max}$, to constitute a construction sequence P', where elements in the subnet remain in an original sequential order.

Step 201: Demap the construction sequence P' to a reliability ranking sequence Q' based on a rate matching rule.

Step 202: Read K elements having largest reliability values from the reliability ranking sequence Q' to obtain an information bit sequence number set A, where its complementary set $A^c$ (relative to a set $\{0, 1, 2, \ldots, N-1\}$) is a frozen bit position set.

It should be noted that a mapping sequence $MAP_n$ used when the construction sequence P' is demapped to the reliability ranking sequence Q' based on the rate matching rule in step 201 in this embodiment is calculated by using the following method:

(1) Read a subset of $P_i<N$ from a construction sequence $\{P_i, 0≤i<N_{max}\}$ corresponding to a mother code sequence whose maximum length is $N_{max}$, to constitute a construction sequence P', where elements in the subnet remain in an original sequential order.

(2) Read a subset of $Q_i<N$ from a construction sequence $\{Q_i, 0≤i<N_{max}\}$ corresponding to a mother code sequence whose maximum length is $Q_{max}$, to constitute a construction sequence Q', where elements in the subnet remain in an original sequential order.

(3) Calculate the mapping $MAP_n$ according to $Q_i=MAP_n([P_i])$, $0≤i<N$.

For different $N=2^n≤N_{max}$, step (1) to step (3) are repeated to calculate the mapping $MAP_n$ corresponding to construction sequences P' of different lengths.

In Embodiment 2, a rate matching rule that is applicable to a puncturing or shortening order of encoded codewords $c_0, c_1, c_2, \ldots, c_{N-1}$ includes but is not limited to five types shown in Table 1.

A rate matching rule 1 is used as an example. A reliability ranking sequence Q of a sequence of polar codes whose code length is $N_{max}=16$ is shown in Table 6, and a rate matching sequence is shown in Table 7. In this case, a generated construction sequence P is shown in Table 8.

TABLE 6

Reliability ranking sequence Q corresponding to a mother code sequence whose maximum length is $N_{max} = 16$

| 0 | 1 | 2 | 4 | 8 | 3 | 5 | 6 | 9 | 10 | 12 | 7 | 11 | 13 | 14 | 15 |
|---|---|---|---|---|---|---|---|---|----|----|---|----|----|----|----|

TABLE 7

Rate matching sequence whose maximum length is $N_{max} = 16$

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|

TABLE 8

Tectonic sequence P whose maximum length is $N_{max} = 16$

| 15 | 14 | 13 | 11 | 7 | 12 | 10 | 9 | 6 | 5 | 3 | 8 | 4 | 2 | 1 | 0 |
|----|----|----|----|---|----|----|---|---|---|---|---|---|---|---|---|

Based on the construction sequence P whose maximum length is $N_{max}=16$, a mapping $MAP_x=N-1-x$ in a function form is used, where $N=2^{\lceil log_2^M \rceil}$, M is an encoding code length, and $\lceil \cdot \rceil$ is rounding up. According to $Q_i=MAP_n([P_i])$, $0≤i<N$, a mapping $MAP_4=\{15,14,13,12,11,7,10,6,9,5,8,4,3,2,1,0\}$ and a mapping $MAP_3=\{7,6,5,2,3,4,1,0\}$ are calculated.

A process of constructing a sequence of polar codes whose encoding code length is M=12 and whose information length is K=8 is as follows:

(1) Determine a mother code length N=16 based on the encoding code length.

(2) Read 12 sequence elements whose values are less than 12 from a construction sequence P whose maximum length is $N_{max}=16$ to constitute a construction sequence P'=$\{11,7,10,9,6,5,3,8,4,2,1,0\}$.

(3) Obtain a reliability ranking sequence Q'=$\{4,8,5,6,9,10,12,7,11,13,14,15\}$ based on a mapping $MAP_x=N-1-x$.

(4) Select the last eight elements in the sequence Q' as an information bit sequence number set A=$\{9,10,12,7,11,13,14,15\}$, where a corresponding frozen bit position set is $A^c=\{0,1,2,3,4,5,6,8\}$.

A process of constructing a sequence of polar codes whose encoding code length is 6 and whose information length is 4 is as follows:

(1) Determine a mother code length N=8 based on the encoding code length.

(2) Read six sequence elements whose values are less than 6 from a construction sequence P whose maximum length is $N_{max}=16$ to constitute a construction sequence P'=$\{5,3,4,2,1,0\}$.

(3) Obtain a reliability ranking sequence Q'=$\{2,4,3,5,6,7\}$ based on a mapping MAP.

(3) Select the last four elements in the sequence Q' as an information bit sequence number set A=$\{3,5,6,7\}$, where a corresponding frozen bit position set is $A^c=\{0,1,2,4\}$.

Embodiment 3

This embodiment describes a process of constructing a sequence of polar codes based on a reliability ranking sequence Q and a combined rate matching rule.

Figure 6:
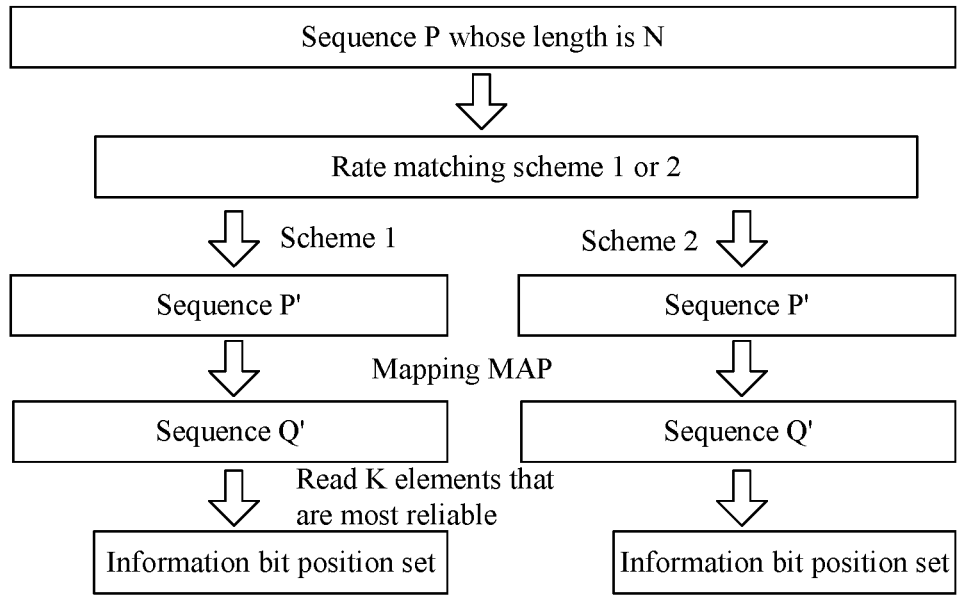
FIG. 6 is a schematic diagram of Embodiment 3 of a method for constructing a sequence of polar codes according to this application.
Figure 7:
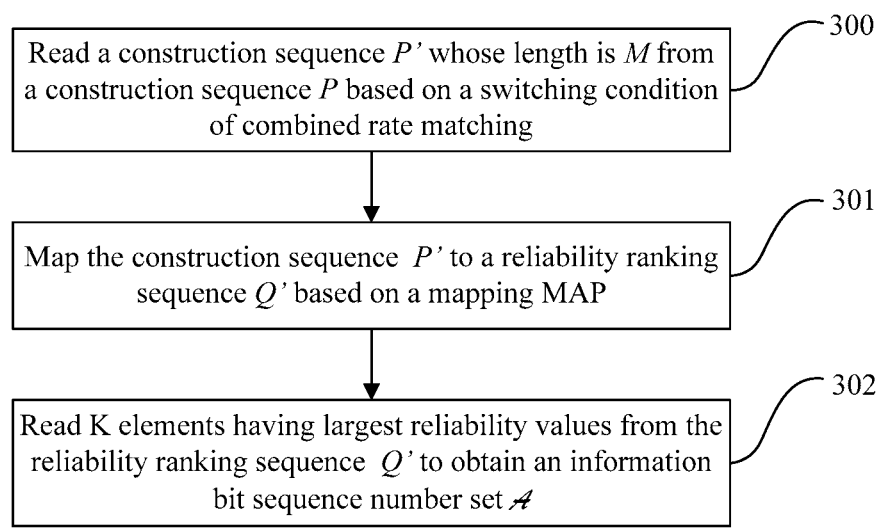
FIG. 7 is a flowchart of Embodiment 3 of a method for constructing a sequence of polar codes according to this application.

When the rate matching rule is a combination of two rate matching rules and largest punctured or shortened sets of the two rate matching rules are complementary (because a mother code length of a sequence of polar codes is 2 raised to the power of an integer, any quantity of bits obtained through any single puncturing or shortening is less than half of the mother code length), a construction sequence P may be used to combine a combined rate matching sequence and a reliability ranking sequence $\{Q_i, 0 \le N\}$ (where N is a length of a reliability ranking sequence Q). In this embodiment, the two rate matching rules are a rate matching rule 1 and a rate matching rule 2, and a combination of the two rate matching rules is a combined rate matching rule. Based on this, the construction sequence P and a mapping MAP are calculated, so that a schematic diagram of a process of constructing a sequence of polar codes whose code length is M and whose information length is K is shown in FIG. 6, a flowchart of the process is shown in FIG. 7, and steps for implementing the process are as follows:

Step 300: Read a construction sequence P' whose length is M from a construction sequence P based on a switching condition of combined rate matching.

Step 301: Map the construction sequence P' to a reliability ranking sequence Q' based on a mapping MAP.

Step 302: Read K elements having largest reliability values from the reliability ranking sequence Q' to obtain an information bit sequence number set A, where its complementary set $A^C$ (relative to a set $\{0,1,\ldots,N-1\}$) is a frozen bit position set.

It should be noted that the construction sequence P whose length is N in the foregoing step 300 is obtained based on the reliability ranking sequence Q and the rate matching rule, and calculation steps are as follows:

(1) For the reliability ranking sequence Q whose code length is $N=2^n \le N_{max}$, obtain a rate matching sequence $\{RM_i, 0 \le i < N\}$ based on the combined rate matching rule, where a larger sequence number i indicates that a corresponding bit position $RM_i$ is to be preferentially punctured or shortened according to the rate matching rule 1, and a smaller sequence number i indicates that a corresponding bit position $RM_i$ is to be preferentially punctured or shortened according to the rate matching rule 2.

(2) Read elements in the rate matching sequence one by one from back to front based on the rate matching sequence $\{RM_i, 0 \le i < N\}$, and search the sequence Q for an element that meets $Q_j = RM_i$.

(3) Set $P_j = i$.

(4) Repeat the foregoing steps until all elements in the rate matching sequence are read to constitute the construction sequence P whose length is N.

In addition, a process of mapping the construction sequence P' to the reliability ranking sequence Q' based on the rate matching rule in the foregoing step 301 may be performed in a function form or in a sequence form. If the sequence form is used, a mapping sequence is expressed as $MAP = \{RM_i, 0 \le i < N\}$.

In this embodiment 3, a rate matching rule that is applicable to a puncturing or shortening order of encoded codewords $c_0, c_1, c_2, \ldots c_{N-1}$ includes but is not limited to five types shown in the following Table 9.

TABLE 9

| Sequence number | Rate matching manner (in a puncturing/shortening order) | Rate matching sequence (in a puncturing/shortening order) |
|---|---|---|
| 1 | Puncturing + shortening | Puncturing: $c_0, c_1, c_2, \ldots c_{\frac{N}{4}-1}, c_{\frac{N}{4}}, c_{\frac{N}{2}}, c_{\frac{N}{4}+1}, c_{\frac{N}{2}+1}, \ldots, c_{\frac{3N}{8}-1}, c_{\frac{5N}{8}-1}$ <br><br> Shortening: $c_{N-1}, c_{N-2}, \ldots c_{\frac{3N}{4}}, c_{\frac{3N}{4}-1}, c_{\frac{N}{2}-1}, c_{\frac{3N}{4}-2}, c_{\frac{N}{2}-2}, \ldots, c_{\frac{5N}{8}}, c_{\frac{3N}{8}}$ |
| 2 | Puncturing + shortening | Puncturing: $C_{BIV(0)}, C_{BIV(1)}, C_{BIV(2)}, \ldots C_{BIV(\frac{N}{2}-1)}$, BIV(.) <br><br> Shortening: $C_{BIV(N-1)}, C_{BIV(N-2)}, \ldots C_{BIV(\frac{N}{2})}$, BIV(.) <br><br> BIV(.), which is a bit reversal order operation |
| 3 | Puncturing + shortening | Puncturing: Puncturing $c_0, c_2, c_4, c_6, \ldots, c_{N-2}$ <br><br> Shortening: $C_{BIV(N-1)}, C_{BIV(N-2)}, \ldots C_{BIV(\frac{N}{2})}$, BIV(.) <br><br> BIV(.), which is a bit reversal order operation |
| 4 | Puncturing + shortening | Puncturing: $c_0, c_1, c_2, \ldots c_{\frac{N}{2}-1}$ <br><br> Shortening: $c_{N-1}, c_{N-2}, \ldots c_{\frac{N}{2}}$ |

A rate matching rule 3 is used as an example. A reliability ranking sequence Q of a sequence of polar codes whose code length is N=8 is shown in Table 10, and a sequence corresponding to a combined rate matching rule is shown in Table 11. If shortening rate matching (referred to as a rate matching rule 1 for short) is used, a shortening order is [7,3,5,1]; if puncturing rate matching (referred to as a rate matching rule 2 for short) is used, a puncturing order is [0,2,4,6]; and therefore, a combined rate matching sequence is [0,2,4,6,1,5,3,7]. A generated sequence P is shown in Table 12.

TABLE 10

Reliability ranking sequence Q

| 0 | 1 | 2 | 4 | 3 | 5 | 6 | 7 |
|---|---|---|---|---|---|---|---|

TABLE 11

Rate matching sequence

| 0 | 2 | 4 | 6 | 1 | 5 | 3 | 7 |
|---|---|---|---|---|---|---|---|

TABLE 12

Tectonic sequence P

| 0 | 4 | 1 | 2 | 6 | 5 | 3 | 7 |
|---|---|---|---|---|---|---|---|

A mapping in a sequence form is used in this embodiment, but is not intended to exclude another form such as a function form, for example, MAP={0,2,4,6,1,5,3,7}.

For a sequence of polar codes whose encoding code length is 6 and whose information length is 4, assuming that a rate matching rule 1 is used, implementation steps of this embodiment are as follows:

Read six sequence elements whose element values are less than 6 from a construction sequence P to constitute a construction sequence P'={0,4,1,2,5,3}.

Obtain a reliability ranking sequence Q'={0,1,2,4,5,6} based on MAP={0,2,4,6,1,5,3,7}.

Select the last four elements in the reliability ranking sequence Q' as an information bit sequence number set A={2,4,5,6}, where a corresponding frozen bit position set is $A^c$={0,1,3,7}.

For a sequence of polar codes whose encoding code length is 6 and whose information length is 4, assuming that a rate matching rule 2 is used, and implementation steps of this embodiment are as follows:

Read six elements whose values are greater than or equal to 2 and less than 8 from a construction sequence P to constitute a construction sequence P'={4,2,6,5,3,7}.

Demap the construction sequence P'={4,2,6,5,3,7} based on MAP={0,2,4,6,1,5,3,7} to obtain a reliability ranking sequence Q={1,4,3,5,6,7}.

Select the last four elements in the reliability ranking sequence Q as an information bit sequence number set A={3,5,6,7}, where a corresponding frozen bit position set is $A^c$={0,1,2,4}.

Embodiment 4

This embodiment describes a process of constructing a sequence of polar codes based on a combined rate matching rule and a reliability ranking sequence Q that has a nesting characteristic.

If a reliability ranking sequence $\{Q_i, 0 \leq i < N_{max}\}$ (where $N_{max}$ is a length of the sequence Q) of a to-be-constructed sequence of polar codes has a nesting characteristic, for $N=2^n<N_{max}$, a reliability ranking sequence $\{Q_i, 0 \leq i < N\}$ is a set including elements that meet $Q_i<N$ and that are obtained from the sequence $\{Q_i, 0 \leq N < N_{max}\}$, where the elements remain in an original sequential order.

When the rate matching rule is a combination of two rate matching rules and largest punctured or shortened sets of the two rate matching rules are complementary (because a mother code length of a sequence of polar codes is $N=2^n \leq N_{max}$, any quantity of bits obtained through any single puncturing or shortening is less than half of the mother code length), a sequence P may be used to combine combined rate matching rule and a reliability ranking sequence $Q_i<N$. The two rate matching rules are a rate matching rule 1 and a rate matching rule 2, and a combination of the two rate matching rules is a combined rate matching rule.

Figure 8:
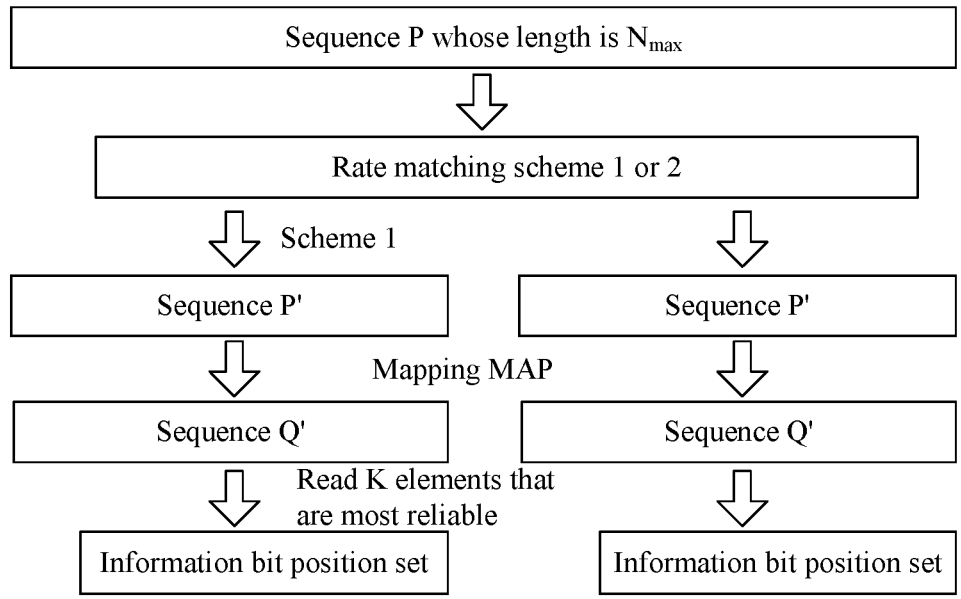
FIG. 8 is a schematic diagram of Embodiment 4 of a method for constructing a sequence of polar codes according to this application.
Figure 9:
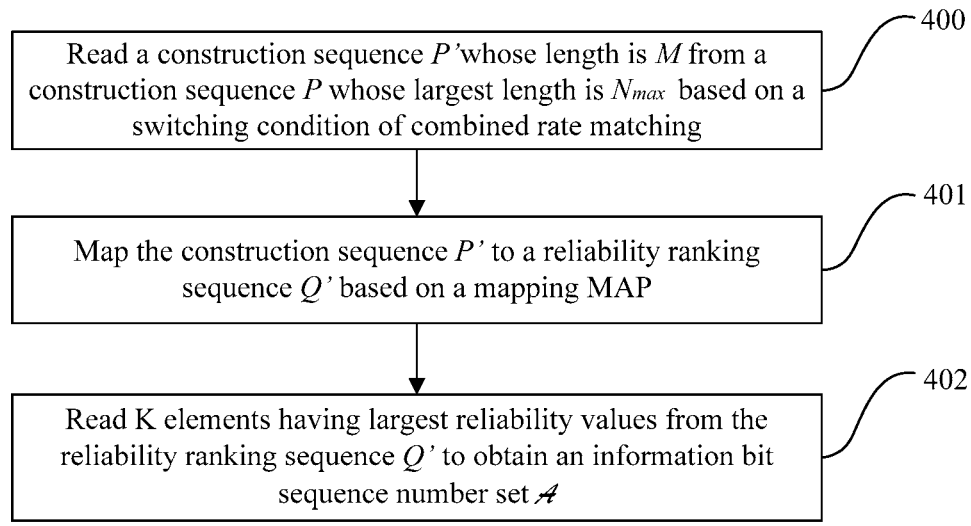
FIG. 9 is a flowchart of Embodiment 4 of a method for constructing a sequence of polar codes according to this application.

Based on Embodiment 3, the sequence P and a mapping MAP are calculated, so that a process of constructing a sequence of polar codes whose encoding code length is M, whose mother code length is $N=2^n \leq N_{max}$, and whose information length is K is shown in FIG. 8, and a flowchart of the process is shown in FIG. 9 as follows:

Step 400: Read a construction sequence P' whose encoding code length is M from a construction sequence P whose largest length is $N_{max}$ based on a switching condition of combined rate matching.

Step 401: Map P' to a sequence Q' based on a mapping MAP.

Step 402: Read K elements having largest reliability values from the sequence Q' to obtain an information bit sequence number set A, where its complementary set $A^c$ (relative to a set {0, 1, . . . , N−1}) is a frozen bit position set.

The sequence P in step 400 is obtained based on a reliability ranking sequence Q and a combined rate matching rule, and calculation steps are as follows:

(1) Calculate a rate matching sequence $\{RM_i, 0 \leq i < N_{max}\}$ based on the combined rate matching rule, where a larger sequence number i indicates that a corresponding bit position $RM_i$ is to be preferentially punctured or shortened according to a rate matching rule 1, and a smaller i indicates that a corresponding bit position $RM_i$ is to be preferentially punctured or shortened according to a rate matching rule 2.

(2) Read elements in the rate matching sequence $\{RM_i, 0 \leq i < N_{max}\}$ one by one from back to front, and search the sequence Q for $Q_j=RM_i$.

(3) Set $P_j=i$.

The foregoing steps are repeated until all elements in the rate matching sequence are read to constitute the construction sequence P whose maximum length is $N_{max}$.

The mapping MAP is used to demap the sequence P' to the sequence Q'. A demapping process may be performed in a function form, a sequence form, or the like. For different $N=2^n \leq N_{max}$, calculation steps of MAP are as follows:

(1) Read a subsequence $P_i<N$ from a sequence $\{P_i, 0 \leq i < N_{max}\}$, where elements in the subsequence remain in an original sequential order.

(2) Read a subsequence $Q_i<N$ from a sequence $\{Q_i, 0 \leq i < N_{max}\}$ where elements in the subsequence remain in an original sequential order.

(3) Calculate a mapping $MAP_n$ according to $Q_i=MAP_n([P_i]), 0 \leq i<N$.

For different $N=2^n \leq N_{max}$, steps (1) to (3) are repeated.

In Embodiment 4, a rate matching rule that is applicable to a puncturing or shortening order of encoded codewords $c_0, c_1, c_2, \ldots, c_{N-1}$ includes but is not limited to five types shown in the foregoing Table 9.

A rate matching rule 1 is used as an example. A reliability ranking sequence Q of a sequence of polar codes whose largest length is $N_{max}=16$ is shown in Table 13, and a sequence corresponding to a combined rate matching rule is shown in Table 14. If the rate matching rule 1 is used, a puncturing or shortening order is [15,14,13,12,11,7,10,6]; or if a rate matching rule 2 is used, a puncturing or shortening order is [0,1,2,3,4,8,5,9]. A generated construction sequence P is shown in Table 15.

TABLE 13

Reliability ranking sequence Q whose length is 16

| 0 | 1 | 2 | 4 | 8 | 3 | 5 | 6 | 9 | 10 | 12 | 7 | 11 | 13 | 14 | 15 |
|---|---|---|---|---|---|---|---|---|----|----|---|----|----|----|----|

TABLE 14

Rate matching sequence whose length is 16

| 0 | 1 | 2 | 3 | 4 | 8 | 5 | 9 | 6 | 10 | 7 | 11 | 12 | 13 | 14 | 15 |
|---|---|---|---|---|---|---|---|---|----|---|----|----|----|----|----|

TABLE 15

Tectonic sequence P whose length is 16

| 0 | 1 | 2 | 4 | 5 | 3 | 6 | 8 | 7 | 9 | 12 | 10 | 11 | 13 | 14 | 15 |
|---|---|---|---|---|---|---|---|---|---|----|----|----|----|----|----|

Based on the sequence P and the combined rate matching rule, the reliability ranking sequence Q' may be obtained through mapping. Herein, a mapping in a sequence form is used, but is not intended to exclude another form such as a function form. A combined mapping MAP is a combination of $MAP_4=\{0,1,2,3,4,8,5,9,6,10,7,11,12,13,14,15\}$ and $MAP_3=\{0,1,2,5,4,3,6,7\}$.

Assuming that the rate matching rule 1 is used, a process of constructing a sequence of polar codes whose encoding code length is 12 and whose information length is 8 to obtain an information bit sequence number set is as follows:

(1) Determine a mother code length N=16 based on the encoding code length.

(2) Read 12 elements whose values are less than 12 from a construction sequence P to constitute a construction sequence $P'=\{0,1,2,4,5,3,6,8,7,9,10,11\}$.

(3) Obtain $Q'=\{0,1,2,4,8,3,5,6,9,10,7,11\}$ based on $MAP_4$.

(4) Select the last eight elements in the sequence Q' as an information bit sequence number set $A=\{8,3,5,6,9,10,7,11\}$, where a corresponding frozen bit position set is $A^c=\{0,1,2,4,12,13,14,15\}$.

Assuming that the rate matching rule 2 is used, a process of constructing a sequence of polar codes whose encoding code length is 12 and whose information length is 6 to obtain an information bit sequence number set is as follows:

(1) Determine a mother code length N=16 based on the encoding code length.

(2) Read 12 elements whose values are greater than or equal to 4 and less than 16 from a construction sequence P to constitute a construction sequence $P'=\{4,5,6,8,7,9,12,10,11,13,14,15\}$.

(3) Demap the construction sequence $P'=\{4,5,6,8,7,9,12,10,11,13,14,15\}$ based on $MAP_4$ to obtain a reliability ranking sequence $Q'=\{4,8,5,6,9,10,12,7,11,13,14,15\}$.

(4) Select the last six elements in the reliability ranking sequence Q' as an information bit sequence number set $A=\{12,7,11,13,14,15\}$, where a corresponding frozen bit position set is $A^c=\{0,1,2,3,4,5,6,8,9,10\}$.

According to the method for constructing a sequence of polar codes provided in this embodiment of this application, a reliability ranking sequence is mapped, and a rate matching process is combined in a process of constructing a sequence, so that the constructed sequence can better adapt to a subsequent rate matching process.

In the foregoing embodiments provided in this application, each solution to constructing a sequence of polar codes provided in the embodiments of this application is described from a perspective of combining a construction sequence and a rate matching sequence to construct a sequence and obtaining an information bit sequence number set. It may be understood that the foregoing method may be implemented in each network element. To implement the foregoing functions, each network element such as a terminal, a base station, or a control node includes a corresponding hardware structure and/or software module for performing the functions. A person skilled in the art should be easily aware that, in combination with the example units and algorithm steps described in the embodiments disclosed in this specification, this application can be implemented by hardware or a combination of hardware and computer software. Whether a function is performed by hardware or computer software-driven hardware depends on particular applications and designed constraint conditions of the technical solutions. A person skilled in the art may use different methods to implement the described functions for each particular application, but it should not be considered that the implementation goes beyond the scope of this application.

Figure 10:
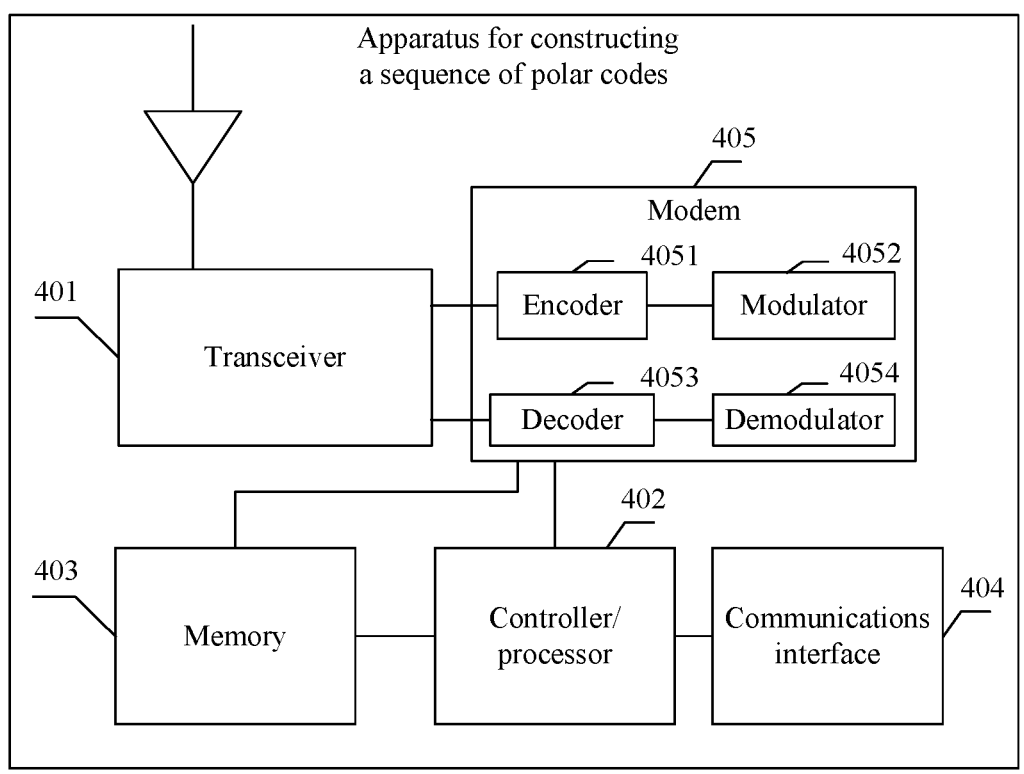
FIG. 10 is a schematic structural diagram of an apparatus for constructing a sequence of polar codes according to this application.

During specific implementation, an apparatus for constructing a sequence of polar codes provided in this application, as shown in FIG. 10, includes:

a memory 403, configured to store a construction sequence P, where the construction sequence P is generated based on a reliability ranking sequence Q and a rate matching rule; and a controller/processor 402, configured to read a construction sequence P' whose length is the same as an encoding code length of a to-be-constructed sequence of polar codes from the construction sequence P.

The controller/processor 402 is further configured to: demap the construction sequence P' to a reliability ranking sequence Q' based on the rate matching rule, and construct the sequence of polar codes based on the reliability ranking sequence Q'.

In addition, the controller/processor 402 is further configured to read elements $RM_i$, one by one from back to front, from a rate matching sequence that represents rate matching, where $\{RM_i, 0 \leq i < N\}$, and search the reliability ranking sequence Q for $Q_j = RM_i$; and set an element with a sequence number i that meets $Q_j = RM_i$ as an element of the construction sequence P to which rate matching is mapped.

In a possible implementation, the reliability ranking sequence Q is obtained through reading by the controller/processor 402 from a reliability ranking sequence of a largest length, where elements in the reliability ranking sequence Q remain in an original sequential order. The controller/processor 402 demaps the construction sequence P' to the reliability ranking sequence Q' based on rate matching in a sequence mapping form or in a function mapping form.

The rate matching rule RM may be a rate matching sequence, or may be a combination of two rate matching sequences.

The controller/processor 402 is further configured to select a rate matching sequence from a combination of two rate matching sequences based on a code length, an information bit length, and a code rate of a to-be-constructed sequence of polar codes.

The apparatus for constructing a sequence of polar codes provided in this application may perform the method steps in the foregoing method embodiments 1 to 4, and details are not described herein again.

Functions of the foregoing controller/processor 402 may be implemented by a circuit, or may be implemented by executing software code by commodity hardware. When the commodity hardware is used, the memory 403 is further configured to store program code that can be executed by the controller/processor 402. The controller/processor 402, when running the program code stored in the memory 403, executes the foregoing functions.

Further, the apparatus for constructing a sequence of polar codes may further include an encoder 4051, a modulator 4052, a demodulator 4054, and a decoder 4053. The encoder 4051 is configured to obtain data/signaling to be sent by a network-side device to a terminal or to be sent by a terminal to a network-side device, and encode the data/signaling. After modulating the data/signaling encoded by the encoder 4051, the modulator 4052 transfers the data/signaling to a transceiver 401, and the transceiver 401 sends the data/signaling to the terminal or another network-side device.

The demodulator 4054 is configured to obtain the data/signaling sent by the terminal or the another network-side device, and demodulate the data/signaling. The decoder 4053 is configured to decode the data/signaling demodulated by the demodulator 4054.

The encoder 4051, the modulator 4052, the demodulator 4054, and the decoder 4053 may be implemented by a combined modem 405. These units perform processing according to a radio access technology (for example, an access technology of an LTE system and another evolved system) used by a radio access network.

The network-side device may further include a communications interface 404, configured to support communication between the apparatus for constructing a sequence of polar codes and another network entity. It may be understood that FIG. 10 merely shows a simplified design of the apparatus for constructing a sequence of polar codes. In actual application, the foregoing transceiver 401 may include a transmitter and a receiver. The apparatus may include any quantity of transceivers, processors, controllers/processors, memories, and/or communications interfaces, and the like.

During specific implementation, the foregoing apparatus may be a terminal or a network-side device. In addition, the network-side device may be a base station or a control node.

The controller/processor of the base station, the terminal, or the control node in this application may be a central processing unit (CPU), a general-purpose processor, a digital signal processor (DSP), an application-specific integrated circuit (ASIC), a field programmable gate array (FPGA) or another programmable logical device, a transistor logic device, a hardware component, or any combination thereof. The controller/processor may implement or execute various example logical blocks, modules, and circuits described with reference to content disclosed in the embodiments of this application. Alternatively, the processor may be a combination implementing a computing function, for example, a combination including one or more microprocessors or a combination of a DSP and a microprocessor.

The methods or algorithm steps described with reference to the content disclosed in this application may be implemented by hardware manner, or may be implemented by executing a software instruction (such as program code) by a processor. The software instruction may include a corresponding software module. The software module may be stored in a RAM memory, a flash memory, a ROM memory, an EPROM memory, an EEPROM memory, a register, a hard disk, a removable hard disk, a CD-ROM memory, or a storage medium in any other forms well-known in the art. A storage medium used as an example is coupled to the processor, so that the processor can read information from the storage medium, and can write information into the storage medium. Certainly, alternatively, the storage medium may be a part of the processor. The processor and the storage medium may be located in an ASIC. In addition, the ASIC may be located in the terminal. Certainly, the processor and the storage medium may exist in the terminal as discrete components.

A person of skill in the art should be aware that in one or more of the foregoing examples, the functions described in this application may be implemented by using hardware, software, firmware, or any combination thereof. When this application is implemented by software, these functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a general or dedicated computer.

The objectives, technical solutions, and benefits of this application are further described in detail in the foregoing specific embodiments. It should be understood that the foregoing descriptions are merely specific embodiments of this application, but are not intended to limit the protection scope of this application. Any modification or improvement made based on the technical solutions of this application shall fall within the protection scope of this application.

What is claimed is:

1. A method for constructing a sequence of polar codes, wherein the method is performed by a terminal device or a network device, and the method comprises:
   extracting a construction sequence P' from a construction sequence P, wherein a length of the construction sequence P' is less than or equal to a length of the construction sequence P; wherein an order of elements in the construction sequence P' is same as an order of corresponding elements in the construction sequence P;
   mapping the construction sequence P' to a reliability ranking sequence Q' based on a rate matching rule;
   extracting, from the reliability ranking sequence Q', K elements that have largest reliability values to form an information bit sequence number set;
   obtaining an encoded bit sequence by performing polar encoding based on the information bit sequence number set and a complementary set of the information bit sequence number set, wherein the complementary set is a frozen bit position set; and outputting the encoded bit sequence.

2. The method according to claim 1, wherein the construction sequence P is generated based on a reliability ranking sequence Q and the rate matching rule, and the reliability ranking sequence Q is obtained based on ranking reliability of each bit position in a mother code sequence in a descending order or an ascending order.

3. The method according to claim 2, wherein generating the construction sequence P based on the reliability ranking sequence Q and the rate matching rule comprises:

extracting elements $RM_i$ one by one from a rate matching sequence that represents a rate matching rule from back to front, wherein $\{RM_i, 0 \leq i < N\}$;

searching the reliability ranking sequence Q for $Q_j = RM_i$; and setting an element with a sequence number i that satisfies $Q_j = RM_i$ in the reliability ranking sequence Q as an element of the construction sequence P.

4. The method according to claim 1, wherein a complementary set $A^c$ of the information bit sequence number set A is a frozen bit position set.

5. The method for constructing a sequence of polar codes according to claim 1, wherein the construction sequence P is obtained through offline calculation based on a reliability ranking sequence Q and the rate matching rule, and steps of the offline calculation includes:

obtaining a rate matching sequence $\{RM_i, 0 \leq i < N\}$ based on the rate matching rule, wherein a larger sequence number i indicates that a corresponding bit position $RM_i$ is to be preferentially punctured or shortened;

reading elements one by one from back to front in the rate matching sequence based on the reliability ranking sequence Q that has a length of $N=2^n$ and the rate matching sequence $\{RM_i, 0 \leq i < N\}$, and searching the reliability ranking sequence Q for an element that satisfies $Q_j = RM_i$;

setting $P_j = i$; and repeating the foregoing steps until all elements in the rate matching sequence are read to constitute the construction sequence P.

6. The method according to claim 1, wherein the mapping the construction sequence P' to a reliability ranking sequence Q' is performed in a function form or in a sequence form.

7. An apparatus for constructing a sequence of polar codes, comprising:

at least one processor; and a non-transitory computer-readable storage medium coupled to the at least one processor, storing a construction sequence P and programming instructions for execution by the at least one processor, the programming instructions instruct the at least one processor to:

extract a construction sequence P' from the construction sequence P, wherein a length of the construction sequence P' is less than or equal to a length of the construction sequence P; wherein an order of elements in the construction sequence is same as an order of corresponding elements in the construction sequence P;

map the construction sequence P' to a reliability ranking sequence Q' based on a rate matching rule;

extract from the reliability ranking sequence Q', K elements that have largest reliability values to form an information bit sequence number set;

obtain an encoded bit sequence by performing polar encoding based on the information bit sequence number set and a complementary set of the information bit sequence number set, wherein the complementary set is a frozen bit position set; and output the encoded bit sequence.

8. The apparatus according to claim 7, wherein the construction sequence P is generated based on a reliability ranking sequence Q and the rate matching rule, and the reliability ranking sequence Q is obtained based on ranking reliability of each bit position in a mother code sequence in a descending order or an ascending order.

9. The apparatus according to claim 8, wherein the construction sequence P is obtained through offline calculation including:

obtaining, by the processor, a rate matching sequence $\{RM_i, 0 \leq i < N\}$ based on rate matching, wherein a larger sequence number i indicates that a corresponding bit position $RM_i$ is to be preferentially punctured or shortened;

extracting, by the processor, elements one by one from back to front in the rate matching sequence based on the reliability ranking sequence Q whose length is $N=2^n$ and the rate matching sequence $\{RM_i, 0 \leq i < N\}$;

searching the reliability ranking sequence Q for an element that satisfies $Q_j = RM_i$;

setting, by the processor, $P_j = i$; and repeating, by the processor, the foregoing operations until all elements in the rate matching sequence are read to constitute the construction sequence P whose length is N.

10. The apparatus according to claim 7, wherein a complementary set $A^c$ of the information bit sequence number set A obtained by the processor is a frozen bit position set.

* * * * *